United States Patent [19]

Kimura et al.

[11] 4,325,630
[45] Apr. 20, 1982

[54] AUTOMATIC MASKING DEVICE INCLUDING AN APERTURE EXTENSION MEANS

[75] Inventors: Yoshikazu Kimura, Kusatsu; Kenjiro Tanabe, Hikone, both of Japan

[73] Assignee: Dainippon Screen Seizo Kabushiki Kaisha, Kyoto, Japan

[21] Appl. No.: 128,035

[22] Filed: Mar. 7, 1980

[30] Foreign Application Priority Data

Mar. 19, 1979 [JP] Japan .................................. 54-32086

[51] Int. Cl.³ ............................................ G03B 27/58
[52] U.S. Cl. ...................................... 355/74; 354/247; 355/126
[58] Field of Search ................................ 355/74, 126; 354/245-249

[56] References Cited

U.S. PATENT DOCUMENTS 3,737,227 6/1973 Harter et al. ........................ 355/74

*Primary Examiner*—Richard A. Wintercorn
*Attorney, Agent, or Firm*—Herbert E. Kidder

[57] ABSTRACT

An automatic masking device including an aperture extension means for use in a printer, wherein a reproduction picture to be projected onto a photosensitive film sheet mounted on a holder is masked by masking plates which are arranged in front of the holder, and are adapted to be movable over the surface of the holder so as to open and close an aperture between the masking plates, and which are adapted to be settled to form the aperture of the predetermined size, and wherein the aperture extension means is capable of extending the aperture beyond the predetermined size and of returning it to the predetermined size.

6 Claims, 4 Drawing Figures

AUTOMATIC MASKING DEVICE INCLUDING AN APERTURE EXTENSION MEANS

BACKGROUND OF THE INVENTION

This invention relates to an automatic masking device including an aperture extension means, used in a printer for plate-making, or the like, in which an original picture is projected, through a focusing lens, onto a photosensitive material such as a film, a plate, or the like, mounted to a photosensitive material holder.

When a plurality of original pictures are printed one by one onto a photosensitive film according to the desired layout by using a grouping camera or a projector, each original picture is projected onto the film through a focusing lens and an aperture of a masking device which masks the surface of the photosensitive film except the corresponding portion of each picture.

In a conventional method, when the edge portion c of an original picture b having a dark opaque frame a, as shown in FIG. 1, projected onto a focusing glass is masked by using a masking device, the dark frame a of the picture b is prone to be confused with an inner edge e of a mask, with a result of a wrong trimming.

Further, it is rather difficult and troublesome to carry out a trimming of a part of a small size with respect to the original picture through the aperture of the mask.

SUMMARY OF THE INVENTION

Therefore, it is an object of the present invention to provide an automatic masking device including an aperture extension means for use in a printer free from the abovementioned inconveniences, which is capable of setting the aperture size of the masking plates to the desired value and extending the aperture size of the masking plates to a certain amount, as occasion required, such as in the case that the trimming position of the picture reproduction is to be checked, or the like, and which is simple and reliable in operation.

According to the present invention there is provided an automatic masking device used in a printer, comprising a photosensitive film sheet holder on which a photosensitive film sheet is to be held, a pair of masking plates which are arranged in front of the photosensitive film sheet holder, and are adapted to be movable over the surface of the holder so as to open and close an aperture between the masking plates, and which are adapted to form the aperture of the predetermined size, and an aperture extension means which is capable of extending the aperture of the predetermined size to a certain amount, and returning it to the predetermined size.

BRIEF DESCRIPTION OF DRAWINGS

In order that the present invention may be better understood, a preferred embodiment thereof will now be described with reference to the accompanying drawings, in which.

DESCRIPTION OF A PREFERRED EMBODIMENT

Figure 1:
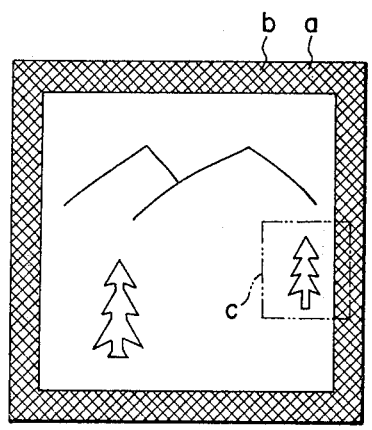
FIG. 1 is a schematic view of an original picture having a dark frame in its surroundings to be printed by a grouping camera by using a conventional masking device.
Figure 2:
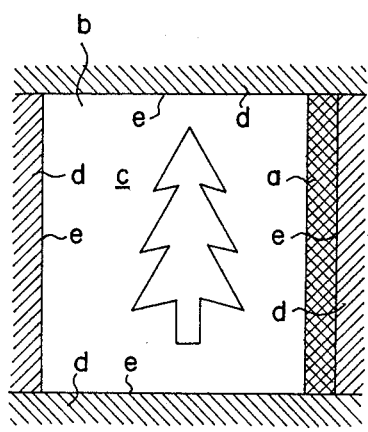
FIG. 2 is a schematic view of a reproduction picture of a part of the picture of FIG. 1, which is projected onto a focusing glass.
Figure 4:
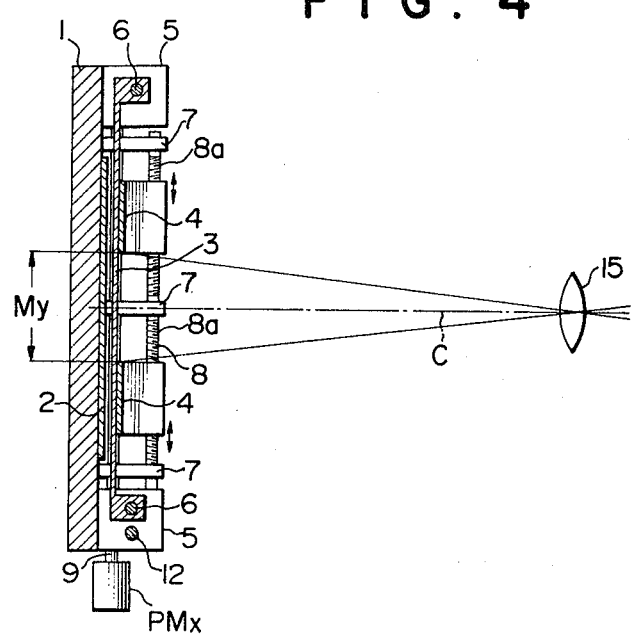
FIG. 4 is a longitudinal cross-section, taken along the line IV—IV in FIG. 3.
Figure 3:
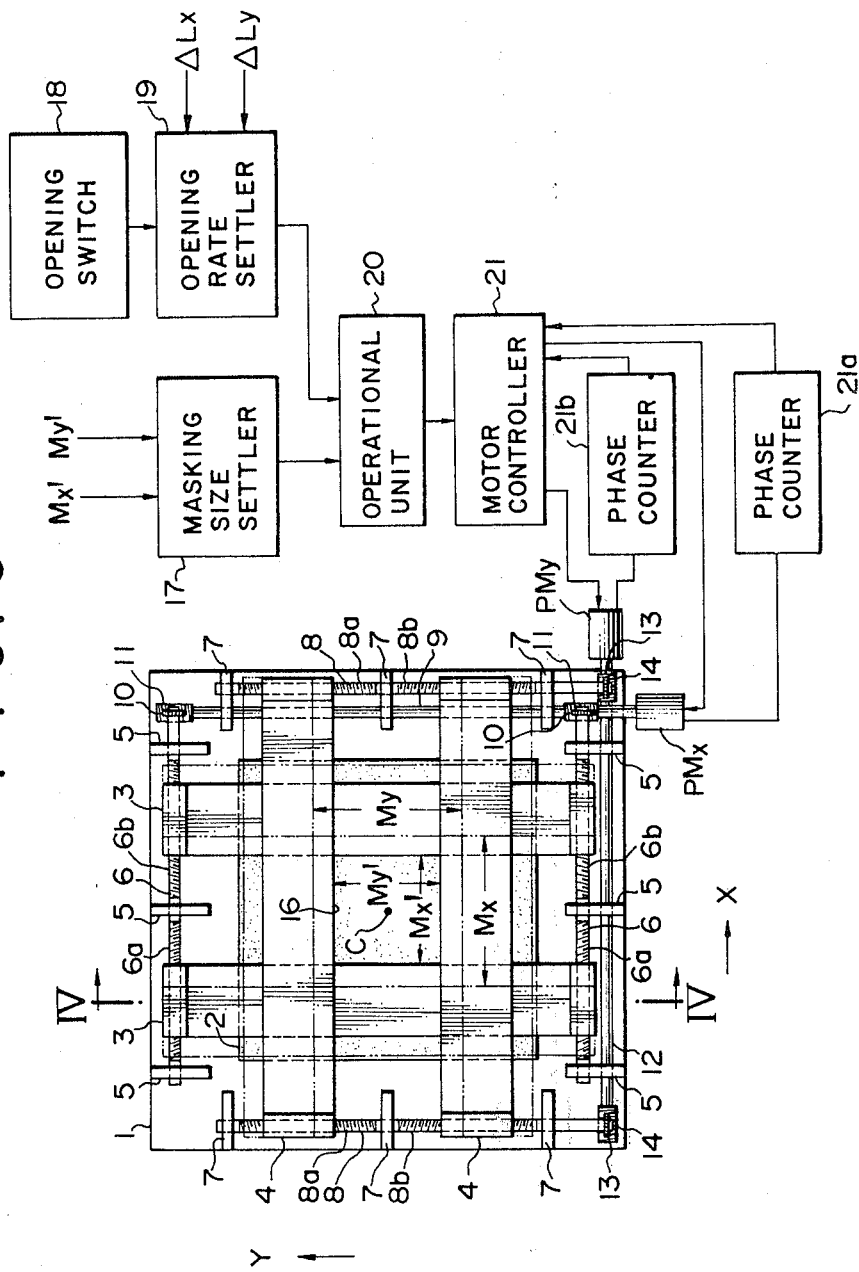
FIG. 3 is a schematic elevational view of an automatic masking device together with a diagram of an electric control circuit according to the present invention.

There is shown in FIGS. 3 and 4 an automatic masking device including an aperture extension means according to the present invention.

On a vertical support plate 1 is properly secured a photosensitive material 2 such as a photosensitive film sheet having a thickness, for example, by means of a vacuum suction means, or the like. In practice, the photosensitive film 2 is preferably held by a film holder means which is able to move in vertical and horizontal directions over the surface of the vertical support plate 1.

Two pairs of vertical and horizontal masking plates 3 and 4 are movably mounted, in contact with or away from the surface of the photosensitive material 2, to upper, lower, left and right screw rods 6 and 8 which are rotatably mounted to upper, lower, left and right edges of the vertical plate 1 via bearing members 5 and 7. Each screw rod 6 or 8 includes a normal and reverse screw portions in its left and right or upper and lower half parts 6a and 6b or 8a and 8b in FIG. 3, which the tapped ends of the masking plates 3 or 4 are engaged with. Thus, each pair of masking plates 3 or 4 may be moved toward or away from a central light axis C which passes through the center of the vertical support plate 1, in X or Y direction in FIG. 3 by driving the screw rods 6 or 8.

A coupling rod 9 is rotatably mounted to the bearing members 7 in parallel with the screw rod 8 positioned in the right hand side of the vertical plate 1 in FIG. 3. A pair of worm wheels 10 are connected to one ends, the right hand side ends in FIG. 3, of the screw rods 6, and a pair of worms 11 are fixed to the upper and the lower ends of the coupling rod 9 so that the worm wheels 11 and the worms 11 may be engaged with one another. The coupling rod 9 is driven by a pulse motor PMx connected to its lower end, which is capable of rotating the coupling rod 9 clockwise and counterclockwise, and whose rotation number and phase can be detected.

Another coupling rod 12 is rotatably mounted to the bearing members 5 in parallel with the screw rod 6 positioned in the bottom of the vertical plate 1 in FIG. 3. A pair of worm wheels 13 are mounted to the lower ends of the screw rods 8 and a pair of worms 14 are connected to both ends of the coupling rod 12 so that the worm wheels 13 and the worms 14 may be engaged with one another. The coupling rod 12 is driven by another pulse motor PMy of the same type as the one PMx, which is connected to its right hand side end.

Hence, it is readily understood that each pair of masking plates 3 or 4 may be moved toward or away from each other by controlling the pulse motor PMx or PMy, thereby adjusting the horizontal and the vertical opening distances Mx' and My' between the masking plates, as shown in FIG. 3.

A convex focusing lens 15 of a printer is arranged in front of the masking plates 3 and 4 away from the surface of the photosensitive film 2 along the central light axis C. An original picture (not shown) is projected onto the photosensitive film 2 through the lens 15 and the rectangular aperture 16 formed by the masking plates 3 and 4.

A masking size settler 17 having an adjusting dial or slide lever sets up the horizontal and the vertical opening sizes Mx' and My' of the aperture 16 between the masking plates 3 and 4 and outputs signals corresponding to the opening sizes Mx' and My' to an operational unit 20.

An opening switch 18 of a type such as a push button switch, or the like, outputs a control signal to an opening rate settler 19 in which extension amounts ΔLx and ΔLy predetermined for further extension of the aperture 16 in the horizontal and the vertical directions are set. The extension amounts ΔLx and ΔLy may be stored in a memory or be varied by a dial or slide lever provided in the opening rate settler 19.

Depending on the control signal from the opening switch the opening rate settler 19 sends extension signals corresponding to the extension amounts ΔLx and ΔLy, or zero signals or does not send the extension signals to the operation unit 20. The opening switch 18 and the opening rate settler 19 constitute an aperture extension means.

The operational unit 20 operates the output signals from the masking size settler 17 and the extension signals or zero signals from the opening rate settler 19, and outputs signals corresponding to the extended values (Mx'+ΔLx) and (My'+ΔLy) or the not-extended values Mx' and My' to a motor controller 21.

The motor controller 21 controls the pulse motors PMx and PMy depending on the output signals from the operational unit 20 so that real horizontal and vertical opening distances Mx and My between the masking plates 3 and 4 may be coincident with the values (Mx'+ΔLx) and (My'+ΔLy) or Mx' and My' operated in the operational unit 20.

While the pulse motors PMx and PMy are controlled by the motor controller 21, the pulse motors PMx and PMy output pulse signals corresponding to the numbers of rotation and the phases of the motors to phase counters 21a and 21b which output the values corresponding to the numbers of rotation and the phases of the pulse motors to the motor controller 21 in order to detect the precise positions of the masking plates 3 and 4 from the standard point.

When the real opening distances Mx and My are coincident with the operated values (Mx'+ΔLx) and (My'+ΔLy) or Mx' and My', the pulse motors PMx and PMy are stopped automatically, thereby setting the horizontal and the vertical opening distances of the aperture 16 of the masking plates 3 and 4 to the desired values operated in the operational unit 20.

According to the present invention, one of each or both vertical or/and horizontal masking plates may be omitted, as occasion demands, in order to determine the size of the reproduction picture exactly.

Further, three or more pairs of masking plates may be so arranged as to be movable independently as described above.

According to the present invention, induction motors may be used instead of the pulse motors, and rotary encoders may be utilized instead of the coupling rods 9 and 12.

Although the present invention has been described in terms of a preferred embodiment thereof, however, various changes and modifications may be made by those skilled in the art without departing from the scope of the present invention.

What is claimed is:

1. An automatic masking device for use in a printer, comprising:
    a photosensitive film sheet holder on which a photosensitive film sheet is to be held;
    a pair of masking plates which are arranged in front of the photosensitive film sheet holder, and are adapted to be movable over the surface of the holder so as to open and close an aperture between the masking plates, and which are adapted to be set to form an aperture of a predetermined size; and
    an aperture extending means which is capable of temporarily extending the aperture beyond the predetermined size to enable the operator to visually check the marginal area surrounding said aperture of predetermined size prior to making the exposure, and of then automatically returning the aperture to the predetermined size.

2. A device as claimed in claim 1, wherein the aperture extension means comprises an opening switch and an opening rate settler in which extension amount for extending the aperture between the masking plates, the opening switch controlling the opening rate settler whether the aperture size is extended or not.

3. A device as claimed in claim 2, further comprising a masking size settler in which the aperture size predetermined is set, and an operational unit which operates the output signal corresponding to the predetermined aperture size from the masking size settler and the output signal corresponding to the extension amount from the opening rate settler, and then the masking plates being controlled depending on the value obtained by the operational unit so that the aperture may be extended or not be extended.

4. A device as claimed in claim 3, further comprising a controller which controls the masking plates to extend or not to extend depending on the value obtained in the operational unit.

5. A device as claimed in claim 4, wherein the masking plates are driven by a pulse motor which is controlled by the controller.

6. A device as claimed in any of claims 1-5, wherein two pairs of masking plates are so arranged that one pair of masking plates may be movable toward or away from each other in one direction, and the other pair of masking plates may be movable toward or away from each other in the other direction which is perpendicular to the one direction.

* * * * *